United States Patent [19]
Hatano

[11] Patent Number: 5,995,169
[45] Date of Patent: Nov. 30, 1999

[54] SIF SIGNAL PROCESSING CIRCUIT

[75] Inventor: Hiroyuki Hatano, Kyoto, Japan

[73] Assignee: Rohm Co., Ltd., Kyoto, Japan

[21] Appl. No.: 08/768,882

[22] Filed: Dec. 17, 1996

[30] Foreign Application Priority Data

Dec. 20, 1995 [JP] Japan ..................................... 7-331418

[51] Int. Cl.[6] .............................. H04N 5/455; H04N 5/46
[52] U.S. Cl. ......................... 348/726; 348/738; 348/555; 348/736; 455/180.3
[58] Field of Search ..................................... 348/738, 462, 348/480–485, 726, 474, 555, 560; 455/180.3, 209, 221, 130, 141, 552

[56] References Cited

U.S. PATENT DOCUMENTS

| | | | |
|---|---|---|---|
| 4,027,242 | 5/1977 | Yamanaka | 455/77 |
| 4,395,777 | 7/1983 | Oki | 455/183 |
| 4,470,070 | 9/1984 | Griffs | 348/738 |
| 4,511,849 | 4/1985 | Yoshihisa | 455/214 |
| 4,538,119 | 8/1985 | Ashida | 327/116 |
| 4,652,924 | 3/1987 | Davidov | 348/738 |
| 4,817,197 | 3/1989 | Shimizu et al. | 455/208 |
| 5,130,676 | 7/1992 | Mutz | 331/23 |
| 5,281,930 | 1/1994 | Taromaru et al. | 455/208 |
| 5,483,297 | 1/1996 | Song | 348/738 |
| 5,673,088 | 9/1997 | Nah | 348/738 |
| 5,710,994 | 1/1998 | Shiota | 455/260 |

OTHER PUBLICATIONS

Hoke, et al, Sound Carrier Separation Systems, Television Engineering Handbook, 13.118–13.123, 1986.

*Primary Examiner*—Victor R. Kostak
*Assistant Examiner*—Reuben M. Brown
*Attorney, Agent, or Firm*—Nikaido Marmelstein Murray & Oram LLP

[57] ABSTRACT

In an SIF signal processing circuit, an SIF signal, which is an FM signal having a carrier frequency equal to a frequency difference between a video IF carrier and a sound IF carrier, is first converted to a lower carrier frequency common to SIF signals of any broadcasting system, and is then demodulated. The SIF processing circuit is provided with a PLL circuit for converting an SIF signal down to a lower frequency, so that an output from the PLL circuit is mixed with the SIF signal. The output of the PLL circuit is varied in accordance with a broadcasting system. A plurality of frequencies can be easily obtained from the PLL circuit simply by controlling a frequency division factor of its frequency divider. Thus, resonators can be dispensed with except for one for generating a reference oscillation signal.

8 Claims, 4 Drawing Sheets

SIF SIGNAL PROCESSING CIRCUIT

BACKGROUND OF THE INVENTION

1. Field of the Invention

The present invention relates to an SIF (sound intermediate frequency) signal processing circuit for use in a television set, videocassette recorder, or other.

2. Description of the Prior Art

It is customary to use a quadrature circuit to demodulate an SIF signal, which is an FM signal, especially when the SIF signal is demodulated at a high frequency such as 4.5 MHz. However, the use of a quadrature circuit is disadvantageous because of its high distortion factor and unsatisfactory linearity.

For this reason, it is also customary to use instead a pulse counting method, which offers a lower distortion factor and a better linearity. However, in order to demodulate an SIF signal by the pulse counting method, the SIF signal needs to be first converted to a lower frequency of approximately 500 Khz.

In certain geographical areas where television is broadcast in more than one type of television system, such as the NTSC and PAL systems, television receivers and videocassette recorders are usually designed to be capable of receiving broadcast signals of more than one type of television system.

In conventional SIF signal processing circuits, SIF signals carried by carrier waves of different frequencies of 4.5 MHz, 5.5 MHz, 6.0 MHz, and 6.5 MHz are uniformly converted down to 500 kHz. This is achieved by obtaining oscillation signals of 5 MHz, 6 MHz, and 6.5 MHz from different resonators, each designated for a particular type of SIF signal, and selecting with a switch one signal to be supplied from the oscillator to the mixers.

In this case, the 6.0 MHz resonator can be shared between SIF signals of 5.5 MHz and 6.5 MHz, but still three resonators are required in total. Inconveniently, this not only increases the manufacturing costs, but also increases the space occupied by the resonators.

SUMMARY OF THE INVENTION

An object of the present invention is to provide an SIF signal processing circuit that can operate either with only one resonator incorporated in it or with a reference signal supplied from outside.

To achieve the above object, according to the present invention, an SIF signal processing circuit operates and is constructed as follows. An SIF signal is an FM signal having a carrier whose frequency is equal to the frequency difference between a video IF carrier and a sound IF carrier. Such an SIF signal is first converted to a lower carrier frequency common to any television system, and is then demodulated. Specifically, the SIF signal processing circuit is provided with a PLL circuit so that it can convert an SIF signal to a lower frequency by mixing an output from this PLL circuit with the SIF signal, and the PLL circuit is designed to be capable of varying its output in accordance with the television system.

According to this construction, sine wave signals of different frequencies can be easily obtained from the PLL circuit simply by controlling the frequency division factor of a frequency divider thereof. As a result, resonators can be dispensed with except the one for generating a reference oscillation signal, for example.

Moreover, according to the present invention, in the above construction, the PLL circuit receives as a reference signal an output from a crystal oscillator used in a frequency-synthesizer channel selector, and compares this reference signal with an output from a voltage-controlled oscillator provided in the PLL circuit, so that the voltage-controlled oscillator is controlled in accordance with a comparison output.

According to this construction, since an SIF signal is formed from a received broadcast signal, an SIF signal processing circuit is most probably located near a tuner or channel selector. If the channel selector is of a frequency-synthesizer type, it includes a highly stable crystal oscillator having an oscillating frequency around 4 MHz. In such a case, an oscillation signal from the channel selector can be used as a reference signal for the PLL. Thus, no resonator is necessary any more in the SIF signal processing circuit, and still highly stable PLL operation can be secured.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
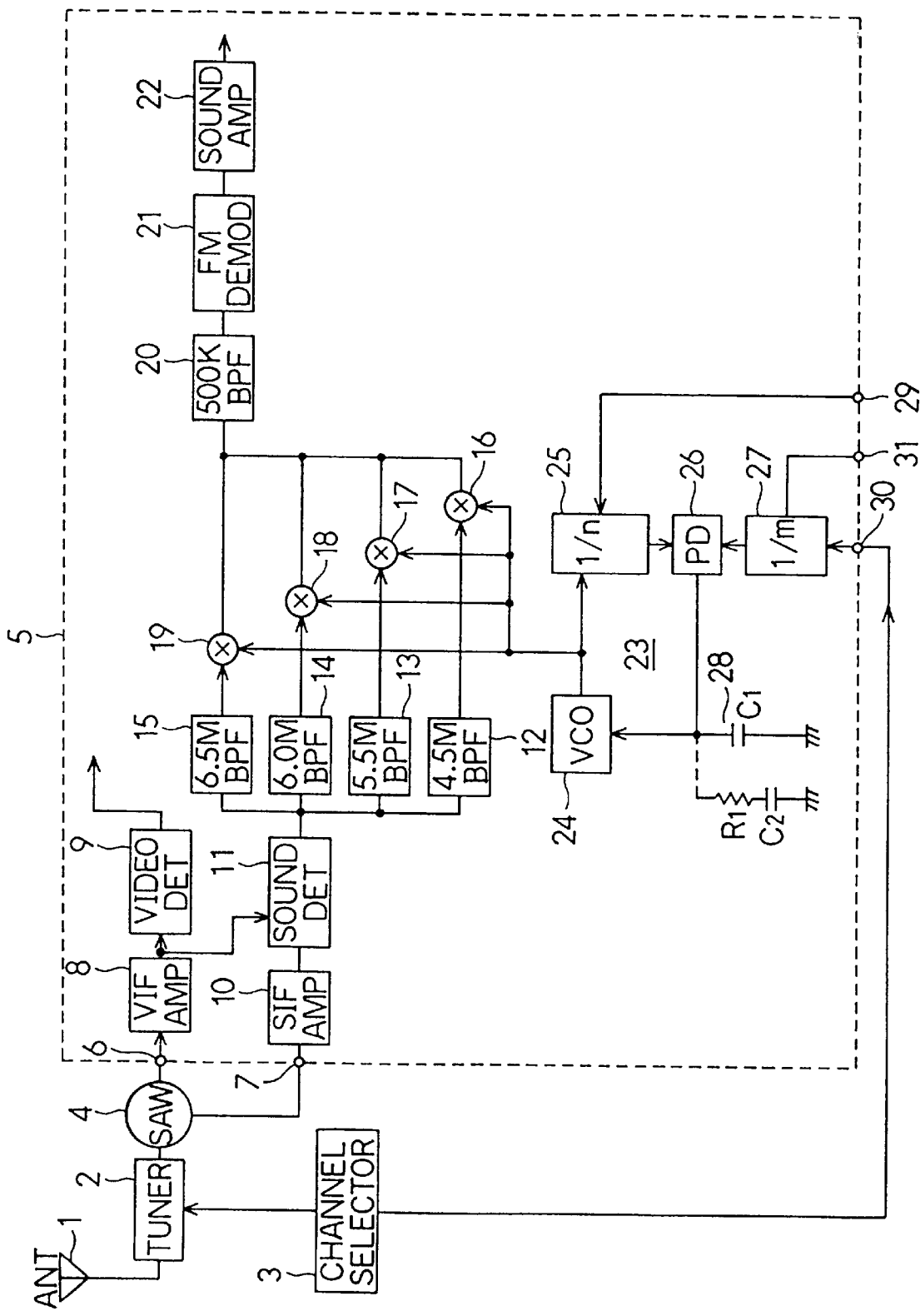
FIG. 1 is a circuit diagram showing the SIF signal processing circuit of first embodiment of the present invention.

Hereinafter, embodiments of the present invention will be described with reference to the drawings. FIG. 1 shows a first embodiment. In the figure, reference numeral 1 represents a television antenna, reference numeral 2 represents a tuner, reference numeral 3 represents a channel selector, and reference numeral 4 represents a SAW (surface acoustic wave) filter. Reference numeral 5 represents an IC (Integrated Circuit), reference numeral 6 represents its video intermediate frequency (VIF) signal input terminal, and reference numeral 7 represents its SIF signal input terminal.

An SIF signal is input to the IC 5 via the input terminal 7, and is amplified by an SIF amplifier 10. The SIF signal is then converted by a sound detection circuit 11 to a signal having a carrier frequency equal to the frequency difference between a VIF carrier and a SIF carrier. For example, in the television broadcasting system of Japan, the input SIF signal is converted into an SIF signal having a carrier frequency of 4.5 MHz which is the difference between the VIF carrier frequency, 58.75 MHz, and the SIF carrier frequency, 54.25 MHz.

Reference numeral 12 represents a band-pass filter whose center frequency is 4.5 MHz. Reference numerals 13, 14, and 15 represent band-pass filters whose center frequencies are 5.5 MHz, 6.0 MHz, and 6.5 MHz, respectively. Here, the frequency 4.5 MHz corresponds to the broadcasting system of Japan (the NTSC-M system) as described above, and the frequencies 5.5 MHz, 6.5 MHz, and 6.0 MHz respectively correspond to those of Germany (the PAL-B/G system), China (the PAL-D/K system), and Great Britain (the PAL-I system).

Reference numerals 16 to 19 represent mixers for beating down the above frequencies 4.5 MHz 5.5 MHz, 6.0 MHz, and 6.5 MHz, respectively, to 500 kHz. To these mixers 16 to 19, an oscillation signal is supplied from a PLL circuit 23, which will be described later. Reference numeral 20 represents a band-pass filter having a center frequency of 500 kHz for filtering the outputs from the mixers 16 to 19 to obtain only signal components having a frequency of 500 kHz (more correctly, signal components within a predetermined band-width about 500 kHz). Reference numeral 21 represents an FM signal demodulator, for example, of a pulse-counting type, and reference numeral 22 represents a sound amplifier for amplifying demodulated sound signals.

The PLL circuit 23 consists of a VCO (voltage-controlled oscillator) 24, a frequency divider 25 for dividing the output frequency of the VCO by a factor of n, a frequency divider 27 for dividing a reference signal supplied from a terminal 30 by a factor of m, a phase comparator 26 for comparing phases between the outputs from these frequency dividers 25 and 27, and a low-pass filter 28 for smoothing the phase comparison output.

To the frequency dividers 25 and 27, frequency division factor data are supplied from a microcomputer via terminals 29 and 31, respectively. The terminal 30 is connected to a channel selector 3 to receive a reference signal having a frequency of 4 MHz from the channel selector 3. It is of course possible to connect the terminal 30 to an oscillation circuit other than the channel selector 3.

Now, assume that the reference signal supplied to the terminal 30 has a frequency of 4 MHz. Then, in order to convert an SIF signal of 4.5 MHz down to 500 kHz, the output from the VCO 24 needs to be 5 MHz. Further, assume that the phase comparator 26 performs phase comparison at 500 kHz. Then, the frequency division factors are n=10 and m=8. The value of m is the same for any type of SIF signal.

For an SIF signal of 5.5 MHz, the VCO 24 needs to output an oscillation signal of 6 MHz, and therefore n=12. Also for an SIF signal of 6.5 MHz, the VCO 24 needs to output an oscillation signal of 6 MHz, and therefore n=12. For an SIF signal of 6.0 MHz, the VCO 24 needs to output an oscillation signal of 6.5 MHz, and therefore n=13. In this way, in this embodiment, the value of m is kept fixed and the value of n is varied, but it is also possible to keep n fixed and vary m. Of the two frequency dividers 25 and 27, the one whose frequency division factor is varied is constructed as a programmable frequency divider. The other one whose frequency division factor is kept fixed may be constructed either as a programmable frequency divider, or as a frequency divider having a physically fixed frequency division factor. In the latter case, no frequency division data need to be supplied to that frequency divider.

Figure 2:
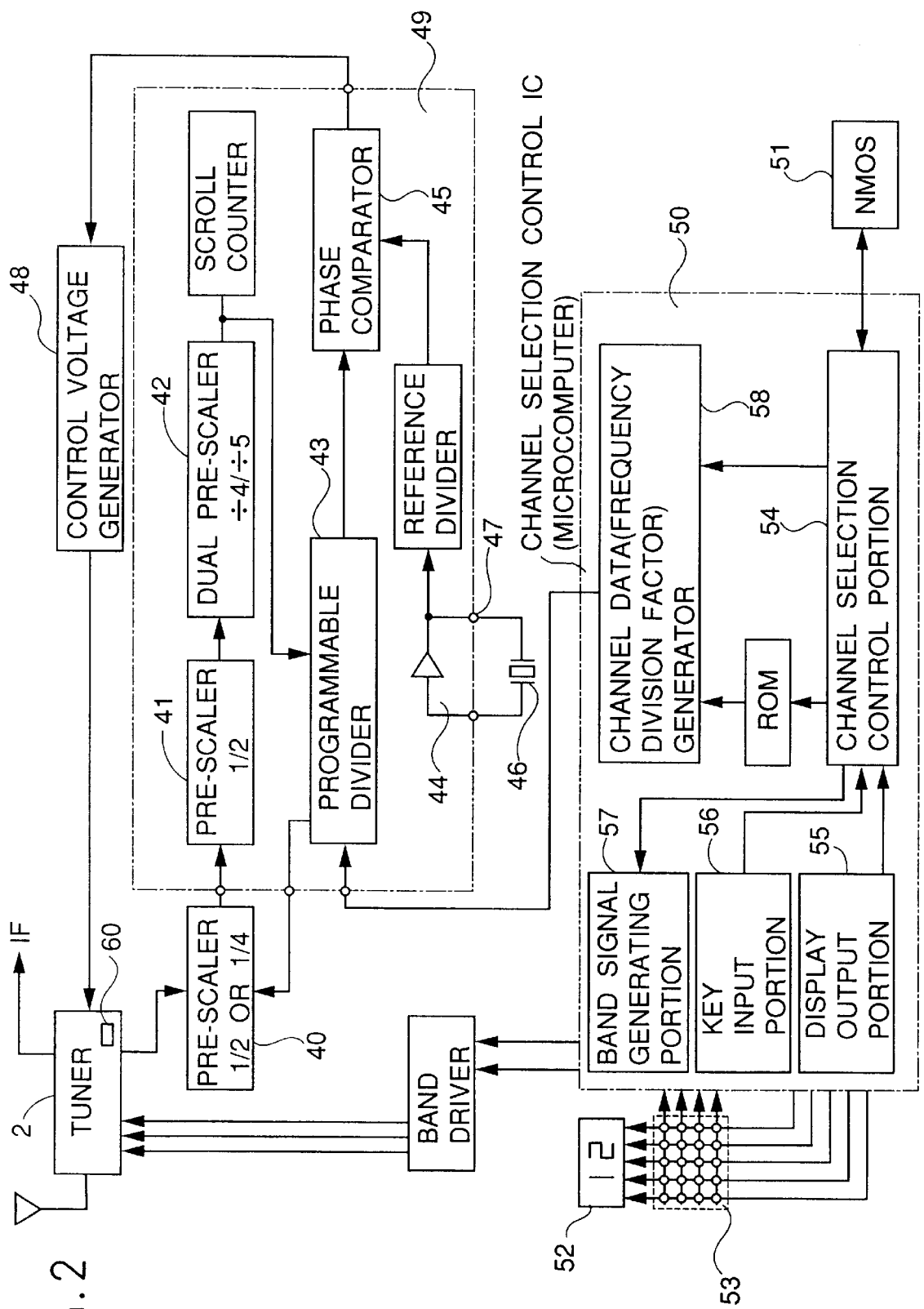
FIG. 2 is a circuit diagram showing the construction of the channel selector shown in FIG. 1.

As the channel selector 3, a channel selector of a frequency-synthesizer type as shown in FIG. 2 is employed. In this figure, the local oscillation circuit 60 of the tuner 2 is controlled by a PLL circuit. The local oscillation signal of the tuner 2 is first divided by a pre-scaler 40 by a predetermined factor, and is then divided by a programmable divider 43 by a factor corresponding to a selected channel.

The reference oscillator 44 is provided with a crystal resonator 46. This oscillator 44 is capable of highly stable oscillation at 4 MHz. The output from the programmable divider 43 and the output from the oscillator 44 are compared by a phase comparator 45. The comparison output is supplied through a control voltage generator 48 constructed of low-pass filters to the tuner 2 to control the oscillation frequency of the local oscillation circuit. Reference numeral 49 represents the portion formed in an IC.

In this case, the local oscillation frequency is determined by the frequency division factor of the programmable divider, and data specifying a frequency division factor are supplied as channel selection data from a microcomputer 50. The microcomputer 50 is constructed of a channel selection control portion 54, a display output portion 55, a key input portion 56, a band signal generating portion 57, and other components. Reference numeral 51 represents a memory in which channel data are stored, reference numeral 52 represents a channel display portion, and reference numeral 53 represents a keypad.

The channel selector shown in FIG. 2 is provided with the highly stable reference oscillator 44. Accordingly, the output of this oscillator 44 can be extracted via a terminal 47 and supplied to the terminal 30 of FIG. 1. This ensures stable operation of the PLL circuit 23, and also eliminates the need to connect a separate oscillator to the terminal 30. Thus, the manufacturing costs can be further reduced as compared with conventional circuits.

In FIG. 1, the low-pass filter 28 may be composed only of a capacitor $C_1$, and therefore it can be formed inside the IC 5. When, as described above, a highly stable oscillation signal is supplied as the reference signal to the terminal 30, there is no need to provide a circuit composed of a resistor $R_1$ and a capacitor $C_2$ in parallel with the capacitor $C_1$. This is because the PLL circuit 23 does not need to follow the capture range frequency (i.e. the frequency of the reference signal, in this case).

Figure 3:
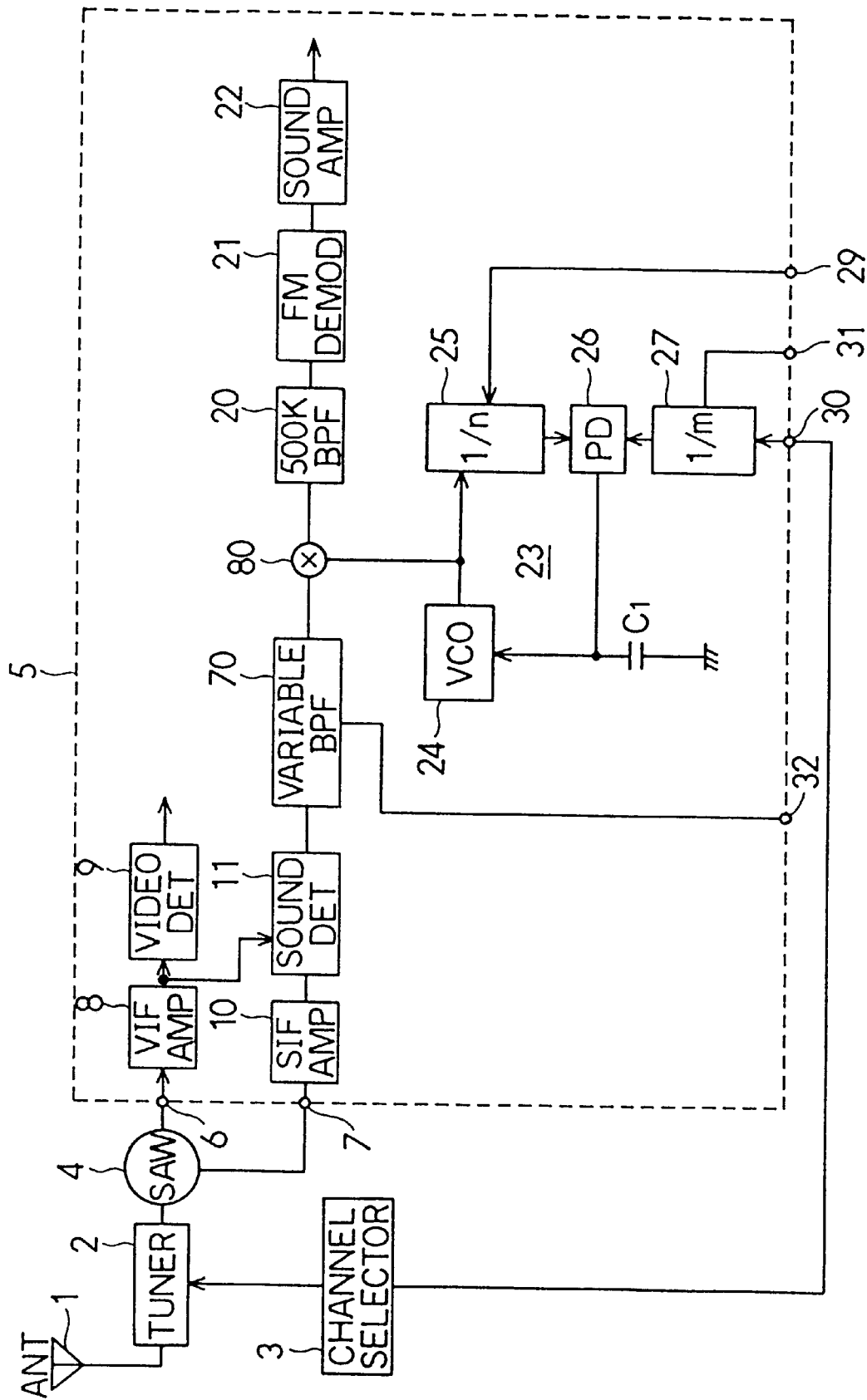
FIG. 3 is a circuit diagram showing the SIF signal processing circuit of second embodiment of the present invention.

FIG. 3 shows a second embodiment. In this embodiment, only one band-pass filter 70 and one mixer 80 are provided. Therefore, the band-pass filter 70 and the mixer 80 are used for all of the four types of broadcasting systems shown in FIG. 1. Instead, the band-pass filter 70 is of a variable-frequency type, so that its center frequency can be varied in accordance with a signal from the terminal 32.

Here, the frequency division factor data supplied to the terminal 29 and the frequency control signal supplied to the terminal 32 are both signals that vary in accordance with the broadcasting system, and these signals can be generated, for example, by the microcomputer 50 shown in FIG. 2, only if the program for the microcomputer 50 is modified.

Figure 4A:
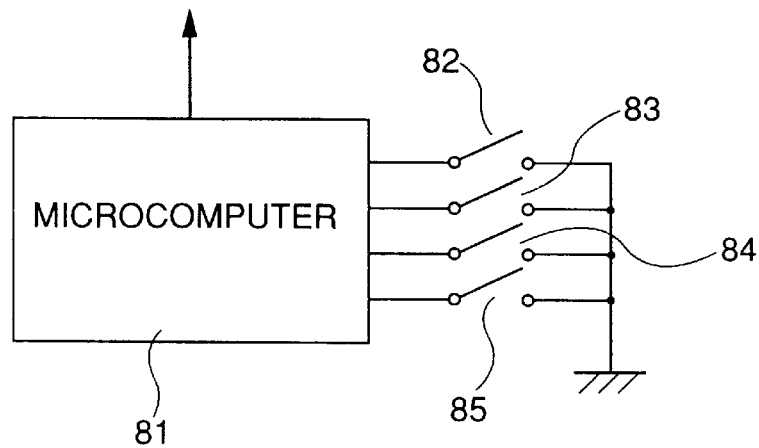
FIGS. 4A, 4B, and 4C are block diagrams showing various types of circuits for generating frequency division factor data for the frequency divider.
Figure 4B:
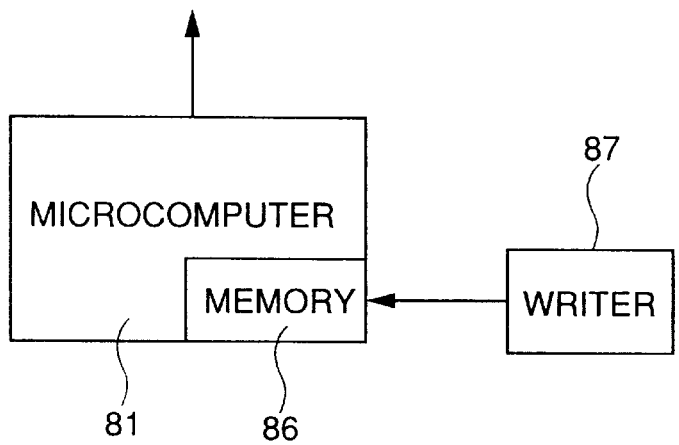
Figure 4C:
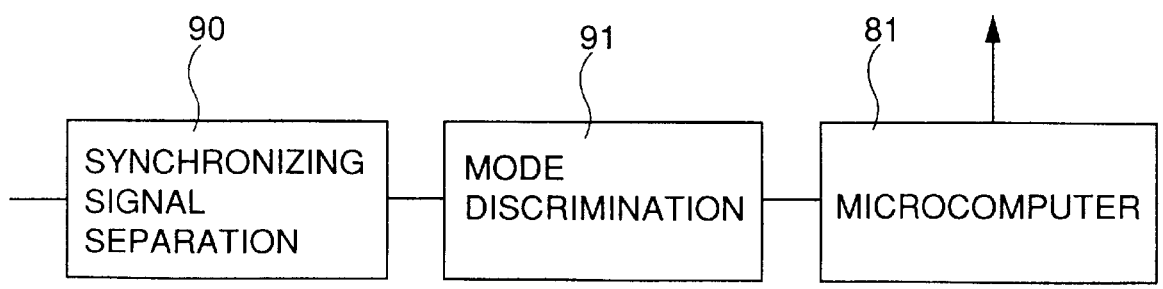

Note that, as the microcomputer, not only the microcomputer for the channel selector of FIG. 2, but also any microcomputer that is used in a television receiver or videocassette recorder for purposes other than channel selection can be used. FIGS. 4A, 4B, and 4C show different examples of the circuit for generating frequency division factor data to be supplied to the terminal 29.

In FIG. 4A, a microcomputer 81 is connected to frequency division factor setting switches 82, 83, 84, and 85, so that the frequency division factor data corresponding to a closed switch are set on the microcomputer 81. This circuit is suitable, for example, for cases where televisions to be distributed in China are manufactured in Japan, because no other setting is needed than setting the switch corresponding to the broadcasting system of China during production or just before delivery.

In FIG. 4B, instead of connecting switches 82 to 85 to the microcomputer 81, setting values are written into a rewritable memory (e.g. EEPROM) of the microcomputer 81 by use of a writer 87. In this case, on completion of writing, the writer 87 is disconnected from the microcomputer. Therefore, only the microcomputer 81 is incorporated in television receivers and videocassette recorders, but the writer 87 is not.

FIG. 4C shows a circuit that detects the type of broadcasting system from received broadcast signals and generates appropriate frequency division factor data. Reference numeral 90 represents a circuit for separating synchronizing signals from received signals. The mode discriminating circuit 91 discriminates the broadcasting system on the basis of the vertical and horizontal synchronizing signals. The microcomputer 81 outputs frequency division factor data in accordance with the discrimination result. Note that, if the microcomputer 81 itself is so configured as to be capable of discriminating the broadcasting system, the mode discrimination circuit 91 can be omitted.

Incidentally, the variable-frequency band-pass filter 70 can be formed within the IC by composing the filter 70 of a differential-amplifier-type gm amplification circuit and a capacitor and by controlling the constant current value of the gm amplification circuit.

What is claimed is:

1. An SIF signal processing circuit comprising:
   a tuner for receiving a television RF signal to output a video IF signal and a sound IF signal;
   a means for producing, from said video IF signal and said sound IF signal, an SIF signal having a carrier wave whose frequency is equal to a frequency difference between a video IF carrier wave and a sound IF carrier wave;
   a PLL circuit;
   a mixer for outputting a signal whose frequency is equal to a frequency difference between an output signal from said PLL circuit and said SIF signal; and
   a varying means for varying a frequency of an output signal from said PLL circuit in accordance with a detected type of television broadcasting system,
   wherein said PLL circuit comprises:
      a voltage-controlled oscillator whose output is supplied to said mixer;
      a first frequency divider for dividing a frequency of an output from said voltage-controlled oscillator;
      a second frequency divider for dividing a frequency of a reference signal;
      a phase comparator for comparing phases between an output from said first frequency divider and an output from said second frequency divider; and
      a low-pass filter for smoothing an output from said phase comparator and applying it as a control voltage to said voltage-controlled oscillator,
   wherein said varying means varies a frequency division factor of at least one of said first and second frequency dividers in accordance with said detected type of television broadcasting system.

2. An SIF signal processing circuit as claimed in claim 1, wherein said PLL circuit receives as a reference signal an output from a crystal oscillator in a frequency-synthesizer channel selector.

3. An SIF signal processing circuit as claimed in claim 1, wherein an SIF signal is supplied to said mixer through a band-pass filter that is capable of varying its center frequency in accordance with said type of broadcasting system.

4. An SIF signal processing circuit comprising: a means for producing from a video IF signal and a sound IF signal, an SIF signal having a carrier wave whose frequency is equal to a frequency difference between a video IF carrier wave and a sound IF carrier wave;
   a plurality of band-pass filters connected to an output of said means;
   a plurality of beat-down-type mixers connected one-to-one to outputs of said band-pass filters;
   a PLL circuit for supplying oscillation signals to said plurality of mixers;
   a means for setting frequencies of oscillation signals from said PLL circuit in accordance with a detected type of television broadcasting system; and
   an FM signal demodulator for demodulating an FM signal output from one of said mixers,
   wherein said PLL circuit comprises:
      a voltage-controlled oscillator whose output is supplied to said mixer;
      a first frequency divider for dividing a frequency of an output from said voltage-controlled oscillator;
      a second frequency divider for dividing a frequency of reference signal;
      a phase comparator for comparing phases between an output from said first frequency divider and an output from said second frequency divider; and
      a low-pass filter for smoothing an output from said phase comparator and applying it as a control voltage to said voltage-controlled oscillator,
   wherein said means for setting frequencies varies a frequency division factor of at least one of said first and second frequency dividers in accordance with said detected type of television broadcasting system.

5. An SIF signal processing circuit as claimed in claim 4, wherein said FM signal demodulator is of a pulse-counting type.

6. An SIF signal processing circuit as claimed in claim 5, wherein a signal output from said mixer has a 500 kHz carrier.

7. An SIF signal processing circuit as claimed in claim 6, wherein said plurality of band-pass filters are four filters having center frequencies of 4.5 MHz 5.5 MHz, 6.0 MHz, and 6.5 MHz, respectively.

8. An SIF signal processing circuit comprising:
   a means for producing, from a video IF signal and a sound IF signal, an SIF signal having a carrier wave whose frequency is equal to a frequency difference between a video IF carrier wave and a sound IF carrier wave;
   a band-pass filter connected to an output of said producing means;
   a first varying means for varying a center frequency of said band-pass filter in accordance with a detected type of television broadcasting system;
   a PLL circuit;
   a mixer for outputting a signal whose frequency is equal to a frequency difference between an output signal from said PLL circuit and said SIF signal; and
   a second varying means for varying a frequency of an output signal from said PLL circuit in accordance with said detected type of television broadcasting system,
   wherein said PLL circuit comprises:
      a voltage-controlled oscillator whose output is supplied to said mixer;
      a first frequency divider for dividing a frequency of an output from said voltage-controlled oscillator;
      a second frequency divider for dividing a frequency of a reference signal;
      a phase comparator for comparing phases between an output from said first frequency divider and an output from said second frequency divider; and
      a low-pass filter for smoothing an output from said phase comparator and applying it as a control voltage to said voltage-controlled oscillator,
   wherein said second varying means varies a frequency division factor of at least one of said first and second frequency dividers in accordance with said detected type of television broadcasting system.

* * * * *